United States Patent
Tang

(10) Patent No.: US 8,250,264 B2
(45) Date of Patent: Aug. 21, 2012

(54) STORAGE AND METHOD FOR PERFORMING DATA BACKUP USING THE STORAGE

(75) Inventor: Chiang-Chung Tang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 398 days.

(21) Appl. No.: 12/641,590

(22) Filed: Dec. 18, 2009

(65) Prior Publication Data

US 2011/0016262 A1 Jan. 20, 2011

(30) Foreign Application Priority Data

Jul. 17, 2009 (CN) .......................... 2009 1 0304484

(51) Int. Cl.
*G06F 12/16* (2006.01)
*H03M 7/30* (2006.01)

(52) U.S. Cl. ............................ 710/68; 711/103; 711/162
(58) Field of Classification Search .................. None
See application file for complete search history.

(56) References Cited

U.S. PATENT DOCUMENTS

| | | | | |
|---|---|---|---|---|
| 7,464,240 B2* | 12/2008 | Caulkins et al. | ............... | 711/165 |
| 7,636,804 B2* | 12/2009 | Bolt et al. | ........................ | 710/68 |
| 7,937,601 B2* | 5/2011 | Bakker et al. | ................. | 713/330 |
| 7,954,006 B1* | 5/2011 | Mangipudi | ..................... | 714/22 |
| 7,990,797 B2* | 8/2011 | Moshayedi et al. | .......... | 365/229 |

\* cited by examiner

*Primary Examiner* — Gary J Portka
(74) *Attorney, Agent, or Firm* — Altis Law Group, Inc.

(57) ABSTRACT

A method for performing data backup using a storage device starts a backup battery when an electronic device is powered off, reads data from a memory of the electronic device by a system on chip (SoC) of the storage device, and writes the data into a field programmable gate array (FPGA) of the storage device. The method further encodes the data by the FPGA, and stores the encoded data into a flash memory of the storage device.

8 Claims, 4 Drawing Sheets

US 8,250,264 B2

STORAGE AND METHOD FOR PERFORMING DATA BACKUP USING THE STORAGE

BACKGROUND

1. Technical Field

Embodiments of the present disclosure relate to data backup technology, and particularly to a storage and method for performing data backup using the storage.

2. Description of Related Art

Data backup of a memory in an electronic device is important when the electronic device is powered off. A current storage device 5 used to backup data in the memory refers to FIG. 1. As shown in FIG. 1, a system on chip (SoC) 16 of the storage device 5 copies data in the memory 10 to a flash memory 18 when the electronic device is powered off. The SoC 16 sends the data stored in the flash memory 18 back to the memory 10 when the electronic device 5 is powered on. However, a storage capacity of the flash memory 18 must be greater than or equal to a storage capacity of the memory 10, so as to ensure all the data in the memory 10 have been backup in the flash memory 18. Therefore, prompt and efficient data backup of the memory 10 in the electronic device is desirable.

DETAILED DESCRIPTION

Figure 1:
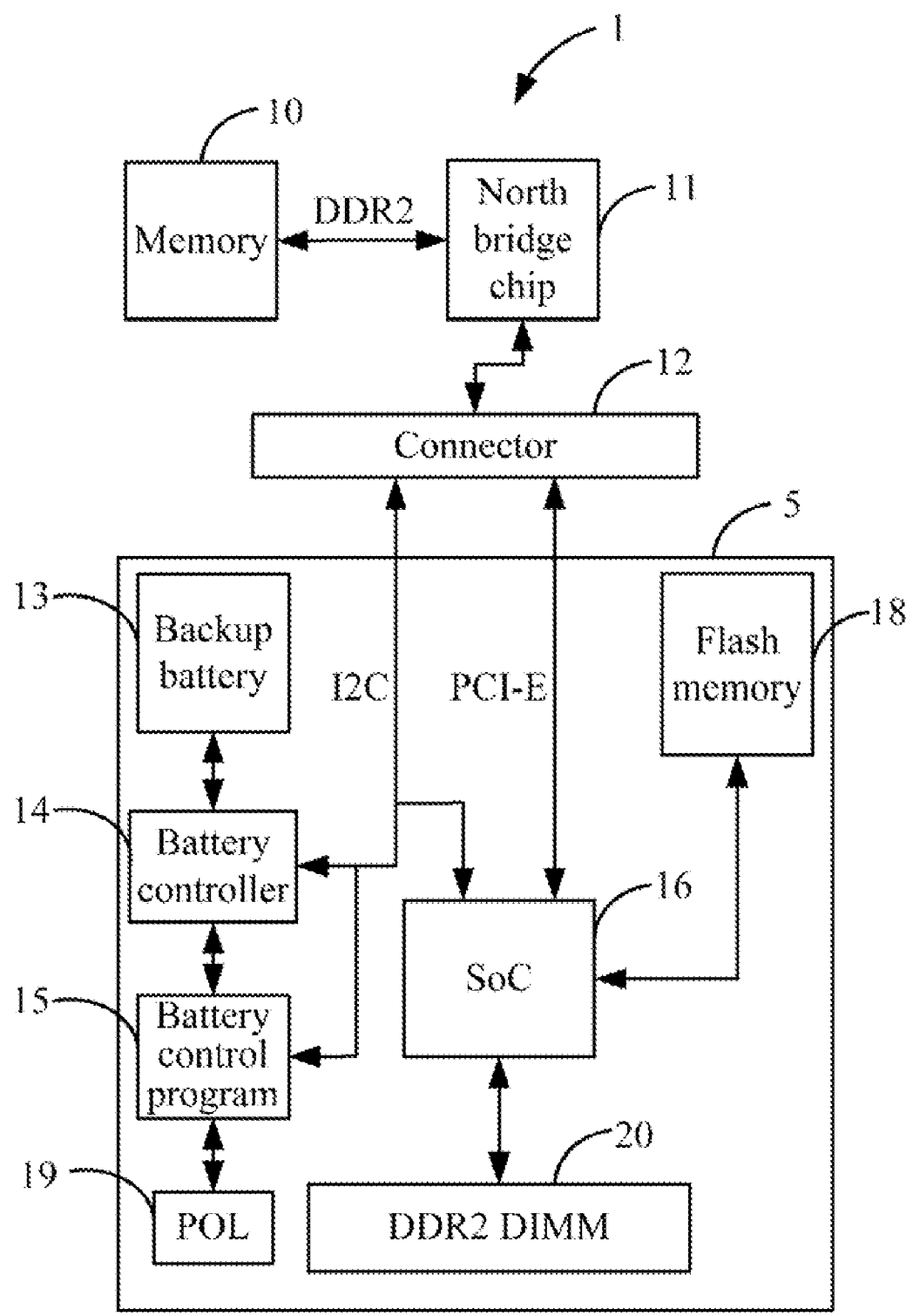
FIG. 1 is a schematic diagram of a storage device in the prior art.
Figure 2:
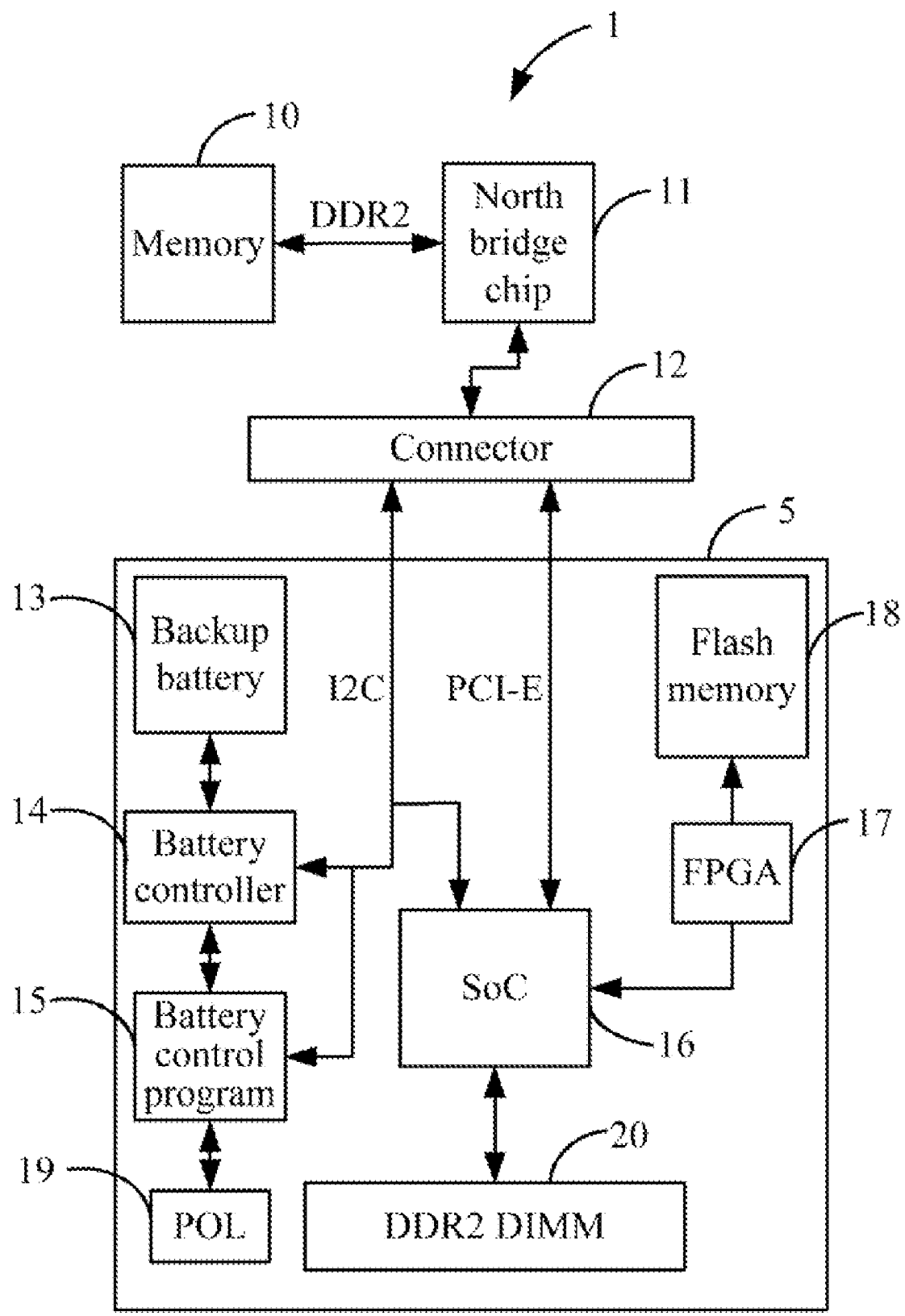
FIG. 2 is a schematic diagram of one embodiment of a storage device used for performing data backup.

FIG. 2 is a schematic diagram of one embodiment of a storage device 5 used for performing data backup in an electronic device 1. In one embodiment, the storage device 5 is connected to a north bridge chip 11 through a connector 12, and the north bridge chip 11 is further connected to a memory 10 through a data line (e.g., double data rate 2, DDR2). In one embodiment, the connector 12 may be a peripheral component interconnect-express (PCI-E) connector. The storage device 5 may include a backup battery 13, a battery controller 14, a battery control program 15, a system on chip (SoC) 16, a field programmable gate array (FPGA) 17, a flash memory 18, a voltage reduction circuit 19, and a DDR2 dual in-line memory module (DDR2 DIMM) 20. In one embodiment, the battery control program may be installed in a firmware, such as a programmable read-only memory (PROM). The voltage reduction circuit 19 may be a point of load (POL) circuit, for example.

Referring to FIG. 2, in one embodiment, the SoC 16 is connected to the connector 12 through a data line (e.g., the PCI-E data line), the battery controller 14 is electrically connected to the backup battery 13, the battery control program 15, and the SoC 16. The battery control program 15 is further electrically connected to the voltage reduction circuit 19. The battery controller 14 and the battery control program 15 are connected to the connector 12 through a data line, such as an inter integrated circuit (12C). The SoC 16 is electrically connected to the DDR2 DIMM 20. In one embodiment, the SoC 16 is further electrically connected to the flash memory 18 through the FPGA 17. In one embodiment, the voltage reduction circuit 19 may be used to reduce a voltage of the storage device 5 if the voltage is greater than a preset value, and the DDR2 DIMM 20 may be used to store data when there is no more space in the flash memory 18. A detailed description of a structure of the FPGA 17 refers to FIG. 3.

Figure 3:
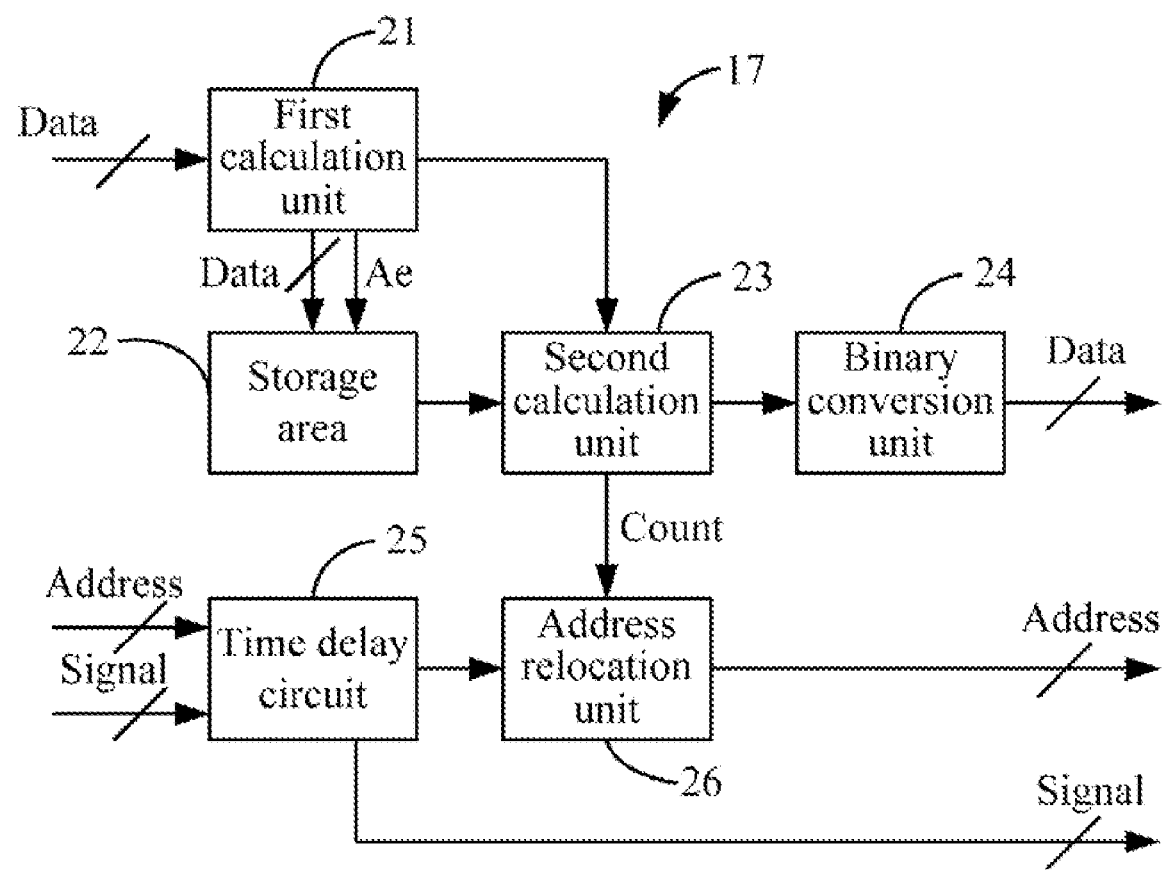
FIG. 3 is a schematic diagram of one embodiment of a field programmable gate array (FPGA) of the storage device in FIG. 2.

FIG. 3 is a schematic diagram of one embodiment of the FPGA 17 of the storage device 5 in FIG. 2. In one embodiment, the FPGA 17 may include a first calculation unit 21, a storage area 22, a second calculation unit 23, a binary conversion unit 24, a time delay circuit 25, and an address relocation unit 26. In one embodiment, the storage area 22 is electrically connected to the first calculation unit 21 and the second calculation unit 23. The second calculation unit 23 is further electrically connected to the first calculation unit 21, the binary conversion unit 24, and the address relocation unit 26. The time delay circuit 25 is electrically connected to the address relocation unit 26. A detailed description of the function of each component (e.g., the first calculation unit 21) of the FPGA 17 is shown in FIG. 4.

Figure 4:
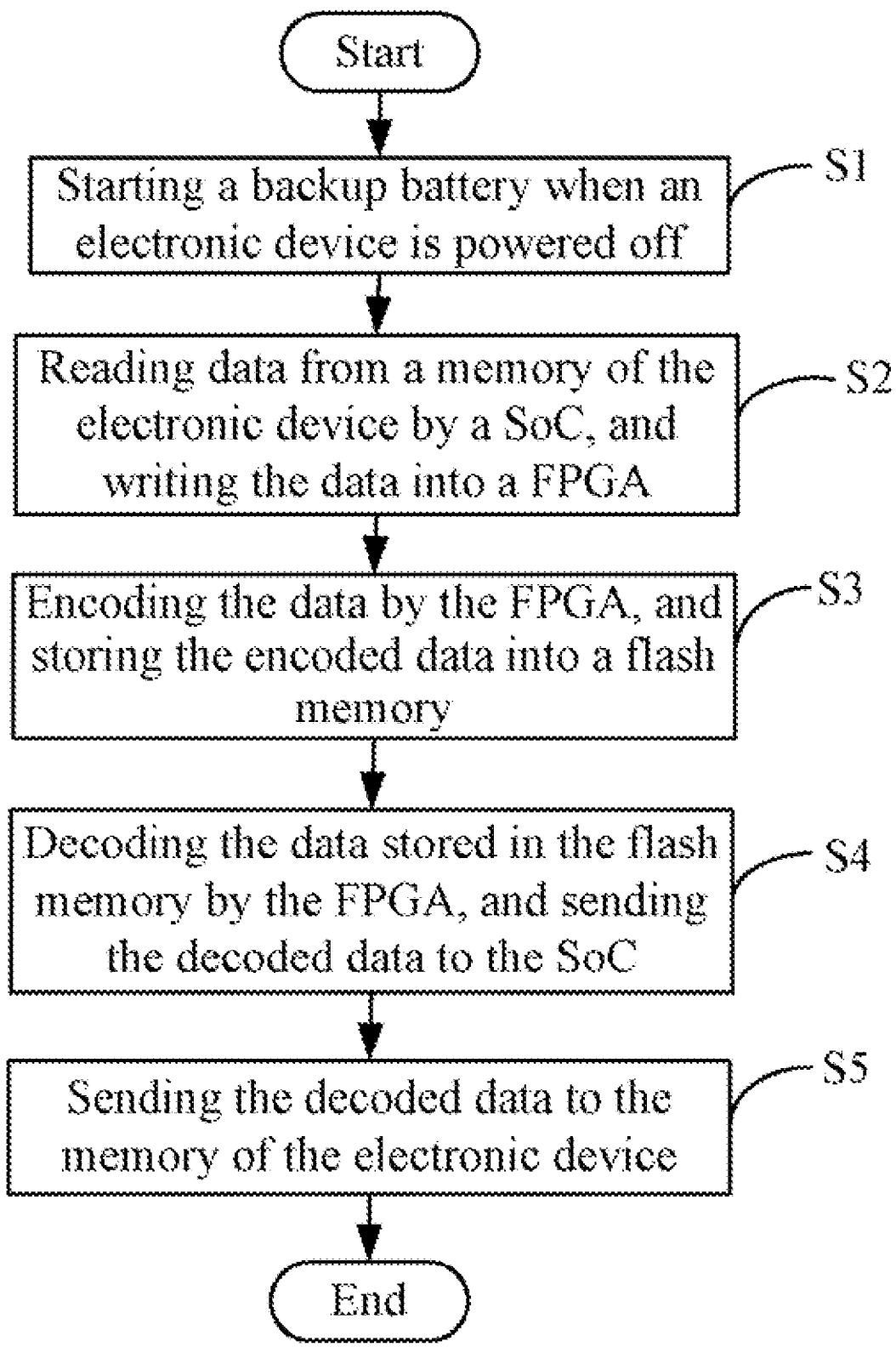
FIG. 4 is a flowchart of one embodiment of a method for performing data backup using the storage device in FIG. 2.

FIG. 4 is a flowchart of one embodiment of a method for performing data backup using the storage device 5 in FIG. 2. Depending on the embodiment, additional blocks may be added, others removed, and the ordering of the blocks may be changed.

In block S1, the battery control program 15 sends a control command to the battery controller 14 when the electronic device 1 is powered off, and the battery controller 14 connects to the backup battery 13 according to the control command Then, the backup battery 13 provides a temporary power supply to the memory 10 and the SoC 16, so as to ensure data stored in the memory 10 is backed up.

In block S2, the SoC 16 reads data from the memory 10 through the connector 12 and the north bridge chip 11, and writes the data into the FPGA 17.

In block S3, the FPGA 17 encodes data, and stores encoded data into the flash memory 18. As encoded data are compressed by the FPGA 17, the storage capacity of the flash memory 18 may be less than the storage capacity of the memory 10, so that the resources used for data backup is reduced. A detailed description of encoding the data using the FPGA 17 is as follows.

Firstly, the first calculation unit 21 uses a symbol set and calculates an occurrence probability of each symbol in the symbol set using an encryption algorithm, and stores the occurrence probability of each symbol in the storage area 22. In one embodiment, the symbol set is selected from the character set of the American standard code for information interchange (ASCII), and the encryption algorithm is an arithmetic coding algorithm.

Secondly, the first calculation unit 21 sends a coding command (represented with "Ae") to the storage area 22 if all the symbols in the symbol set are calculated, and transmits the occurrence probability of each symbol stored in the storage area 22 to the second calculation unit 23.

Thirdly, the second calculation unit 23 calculates a range of each symbol in the symbol set according to the occurrence probability of each symbol, reads data to be encoded (represented with "Data") from the first calculation unit 21, calculates a range of a last symbol in the data to be encoded according to the range of each symbol in the symbol set. One example of calculating ranges will be explained in greater detail below.

Fourthly, the second calculation unit 23 sends a size of the range of the last symbol in the data to be encoded (represented with "Count") to the address relocation unit 26, and sends the range of the last symbol in the data to the binary conversion unit 24. Then, the address relocation unit 26 obtains an address of the data (represented with "Address") from the time delay circuit 25, relocates the address of the data according to the size of the range of the last symbol in the data, and transmits the relocated address of the data to the flash memory 18. In one embodiment, the relocation of the address of the data refers to shift the entire contiguous data by the size of the range of the last symbol in the data. Lastly, the binary conversion unit 24 converts the range of the last symbol in the data to a binary range, and transmits the binary range to the flash memory 18. In one embodiment, the data to be encoded is represented by the binary range.

Fifthly, the time delay circuit 25 transmits an enable signal (represented with "Signal") to the flash memory 18 if the range of the last symbol in the data is converted to the binary range.

An example of encoding the data using the FPGA 17 is as follows. Supposing the symbol set includes symbols of "A, B, C, D, E", an initial occurrence probability of each of the symbols "A, B, C, D, E" is as follows:
A: 0→1/5, B: 1/5→2/5, C: 2/5→3/5, D: 3/5→4/5, E: 4/5→1. That is to say, A goes from 0-20%, B goes from 20%-40%, C goes from 40%-60%, D goes from 60%-80%, and E goes from 80%-100%.

If the data to be encoded are "ABBAC", each symbol occupies 4 bits, thus, an accumulated occurrence probability of each of the symbols of "A, B, C, D, E" is as follows:
A: 1/5→2/6→2/7→2/8→3/9→3/10;
B: 1/5→1/6→2/7→3/8→3/9→3/10;
C: 1/5→1/6→1/7→1/8→1/9→2/10;
D: 1/5→1/6→1/7→1/8→1/9→1/10;
E: 1/5→1/6→1/7→1/8→1/9→1/10.

Then, a range of each of the symbols of "A, B, C, D, E" is as follows: A: [0, 3/10); B: [3/10, 6/10); C: [6/10, 8/10); D: [8/10, 9/10); E: [9/10, 1). A range of a last symbol in the data to be encoded (i.e., "ABBAC") is calculated according to the range of each of the symbols of "A, B, C, D, E" by the following steps:
A: [0, 3/10);
B: [0+3/10*3/10, 0+3/10*6/10)=[9/100, 18/100);
B: [9/100+9/100*3/10, 9/100+9/100*6/10)=[117/1000, 144/1000);
A: [117/1000+27/1000*0, 117/1000+27/1000*3/10)=[1170/10000, 1251/10000);
C: [1170/10000+81/10000*6/10,1170/10000+81/10000*8/10)=[12186/100000,12348/100000)=[0.12186, 0.12348).
The range of the last symbol "C" in the data to be encoded of "ABBAC" is [0.12186, 0.12348), the binary conversion unit 24 converts the decimal number "12186" to the binary number "10111110011010" which occupies 14 bits. The data to be encoded of "ABBAC" is represented by the binary number "10111110011010". Thus, a compression ratio of the data to be encoded of "ABBAC" is calculated by the following equation: 1−(14 bits/5*4 bits)*100%=30%.

In block S4, the FPGA 17 decodes the data stored in the flash memory 18 when the electronic device 1 is powered on, and sends the decoded data to the SoC 16. A process of decoding data is an backward operation of encoding the data which is shown in block S3.

In block S5, the SoC 16 sends the decoded data to the memory 10 of the electronic device 1 through the connector 12 and the north bridge chip 11.

It should be emphasized that the above-described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A storage device for performing data backup, the storage device comprising a backup battery, a battery controller, a battery control program, a system on chip (SoC) and a flash memory, wherein the battery controller is electrically connected to the backup battery, the battery control program, and the SoC, the SoC is electrically connected to the flash memory through a field programmable gate array (FPGA), the FPGA comprises a first calculation unit, a storage area, a second calculation unit, a binary conversion unit, a time delay circuit, and an address relocation unit, and:
   the first calculation unit is operable to calculate an occurrence probability of each symbol in a symbol set, and store the occurrence probability of each symbol in the storage area;
   the first calculation unit is further operable to transmit the occurrence probability of each symbol stored in the storage area to the second calculation unit, if all the symbols in the symbol set are calculated;
   the second calculation unit is operable to calculate a range of each symbol in the symbol set according to the occurrence probability of each symbol;
   the second calculation unit is further operable to read data to be encoded from the first calculation unit, calculate a range of a last symbol in the data according to the range of each symbol in the symbol set, send a size of the range of the last symbol in the data to the address relocation unit, and send the range of the last symbol in the data to the binary conversion unit;
   the address relocation unit is operable to relocate an address of the data according to the size of the range of the last symbol in the data, and transmit the relocated address of the data to the flash memory;
   the binary conversion unit is operable to convert the range of the last symbol in the data to a binary range, and transmit the binary range to the flash memory; and
   the time delay circuit is operable to transmit an enable signal to the flash memory if the range of the last symbol in the data is converted to the binary range.

2. The storage device according to claim 1, wherein the storage device is connected to a north bridge chip through a connector, and the north bridge chip is further connected to a memory.

3. The storage device according to claim 2, wherein the connector is a peripheral component interconnect-express (PCI-E) connector.

4. A method for performing data backup, comprising:
   providing a storage device comprising a backup battery, a battery controller, a battery control program, a system on chip (SoC) and a flash memory, wherein the battery controller is electrically connected to the backup battery, the battery control program, and the SoC, and the SoC is electrically connected to the flash memory through a field programmable gate array (FPGA);
   starting the backup battery when an electronic device is powered off;
   reading data from a memory of the electronic device by the SoC of the storage device, and writing the data into the FPGA of the storage device; and encoding the data by the FPGA, and storing the encoded data into the flash memory of the storage device, wherein the data is encoded by:

providing the FPGA comprising a first calculation unit, a storage area, a second calculation unit, a binary conversion unit, a time delay circuit, and an address relocation unit;

calculating an occurrence probability of each symbol in a symbol set using an encryption algorithm by the first calculation unit, and storing the occurrence probability of each symbol in the storage area;

sending a coding command to the storage area by the first calculation unit if all the symbols in the symbol set are calculated, and transmitting the occurrence probability of each symbol stored in the storage area to the second calculation unit;

calculating a range of each symbol in the symbol set according to the occurrence probability of each symbol by the second calculation unit, reading data to be encoded from the first calculation unit, and calculating a range of a last symbol in the data according to the range of each symbol in the symbol set;

sending a size of the range of the last symbol in the data to the address relocation unit by the second calculation unit, and sending the range of the last symbol in the data to the binary conversion unit;

relocating an address of the data according to the size of the range of the last symbol in the data by the address relocation unit, and transmitting the relocated address of the data to the flash memory;

converting the range of the last symbol in the data to a binary range by the binary conversion unit, and transmitting the binary range to the flash memory; and transmitting an enable signal to the flash memory by the time delay circuit, if the range of the last symbol in the data is converted to the binary range.

5. The method according to claim 4, further comprising:
decoding the data stored in the flash memory by the FPGA when the electronic device is powered on, and sending the decoded data to the SoC; and sending the decoded data to the memory of the electronic device by the SoC.

6. The method according to claim 4, wherein starting a backup battery comprises:
sending a control command to the battery controller by the battery control program; and
connecting the backup battery to the battery controller if the control command is received.

7. The method according to claim 4, wherein the symbol set is selected from the character set of the American standard code for information interchange (ASCII).

8. The method according to claim 4, wherein the encryption algorithm is an arithmetic coding algorithm.

* * * * *